United States Patent
Teraguchi (10) Patent No.: US 12,113,523 B2
(45) Date of Patent: Oct. 8, 2024

(54) HIGH FREQUENCY SWITCH AND SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Takayuki Teraguchi, Kawasaki Kanagawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 29 days.

(21) Appl. No.: 18/180,439

(22) Filed: Mar. 8, 2023

(65) Prior Publication Data

US 2024/0097676 A1 Mar. 21, 2024

(30) Foreign Application Priority Data

Sep. 21, 2022 (JP) ................................. 2022-150175

(51) Int. Cl.
H03K 17/687 (2006.01)

(52) U.S. Cl.
CPC .................................. *H03K 17/687* (2013.01)

(58) Field of Classification Search
None
See application file for complete search history.

(56) References Cited

U.S. PATENT DOCUMENTS

| | | | | |
|---|---|---|---|---|
| 5,748,053 | A | * 5/1998 | Kameyama | .......... H03K 17/693 327/404 |
| 7,391,282 | B2 | * 6/2008 | Nakatsuka | ......... H03K 17/6871 333/101 |
| 8,130,055 | B2 | 3/2012 | Hayashi et al. | |
| 9,667,244 | B1 | * 5/2017 | Cavus | .................. H03K 17/145 |
| 10,014,902 | B2 | 7/2018 | Hayakawa | |
| 11,251,792 | B2 | 2/2022 | Anegawa | |
| 11,716,105 | B2 | * 8/2023 | Chen | .................... H04B 1/0483 455/552.1 |

FOREIGN PATENT DOCUMENTS

| | | |
|---|---|---|
| JP | H09-107203 A | 4/1997 |
| JP | 2013-085290 A | 5/2013 |
| JP | 2020-088643 A | 6/2020 |
| WO | 2016/121455 A1 | 8/2016 |

* cited by examiner

*Primary Examiner* — Jeffrey S Zweizig
(74) *Attorney, Agent, or Firm* — Kim & Stewart LLP (57) ABSTRACT

According to an embodiment, an SPnT-type high frequency switch includes a plurality of first MOS transistors, second MOS transistors, and a capacitor. The plurality of first MOS transistors are connected in series between one of a plurality of RF terminals and an RF common terminal. The second MOS transistors have ends each connected to adjacent first MOS transistors among the first MOS transistors. The capacitor is connected between ground and another end of a second MOS transistor having one end connected to another end of a first MOS transistor having one end connected to the one of the RF terminals among the first and second MOS transistors.

10 Claims, 8 Drawing Sheets

HIGH FREQUENCY SWITCH AND SEMICONDUCTOR DEVICE

CROSS-REFERENCE TO RELATED APPLICATIONS

This application is based upon and claims the benefit of priority from Japanese Patent Application No. 2022-150175, filed on Sep. 21, 2022; the entire contents of which are incorporated herein by reference.

FIELD

Embodiments described herein relate generally to a high frequency switch and a semiconductor device.

BACKGROUND

Conventionally, high frequency switches are known as switches for switching between transmission paths of high frequency signals. The high frequency switches are used, for example, in a wireless communication device such as a mobile phone or a wireless local area network (LAN), to switch between frequency bands or to switch between a transmission path of a transmission signal and a transmission path of a reception signal.

In a high frequency switch intended for high isolation among such high frequency switches, one or a plurality of ground connection MOSFET switch circuits is usually connected between MOSFET switch circuits through-connected between ports.

In a case where such a configuration is adopted, the influence of parasitic inductance component due to wire bonding used for connection from a semiconductor chip to a package frame is not negligible in a high frequency region, and thus there is a possibility that isolation characteristics are deteriorated.

Therefore, it is desired to provide a high frequency switch and a semiconductor device capable of suppressing deterioration of isolation characteristics caused by wire bonding and reliably switching between the signal transmission paths with high isolation.

DETAILED DESCRIPTION

According to an embodiment, a high frequency switch of a single pole n throw (SPnT) type has n (n is an integer greater than or equal to 2) RF terminals and one RF common terminal. The high frequency switch includes m (m is an integer greater than or equal to 2) first MOS transistors, (m−1) second MOS transistors, and a capacitor. The m first MOS transistors are connected in series between one of the n RF terminals and the RF common terminal. The (m−1) second MOS transistors have ends each connected to adjacent first MOS transistors among the m first MOS transistors. The capacitor is connected between ground and another end of a second MOS transistor having one end connected to another end of a first MOS transistor having one end connected to the one of the RF terminals among the first and second MOS transistors.

Hereinafter, a high frequency switch and a semiconductor device according to embodiments will be described in detail with reference to the accompanying drawings. Note that the present invention is not limited by these embodiments.

Figure 9:
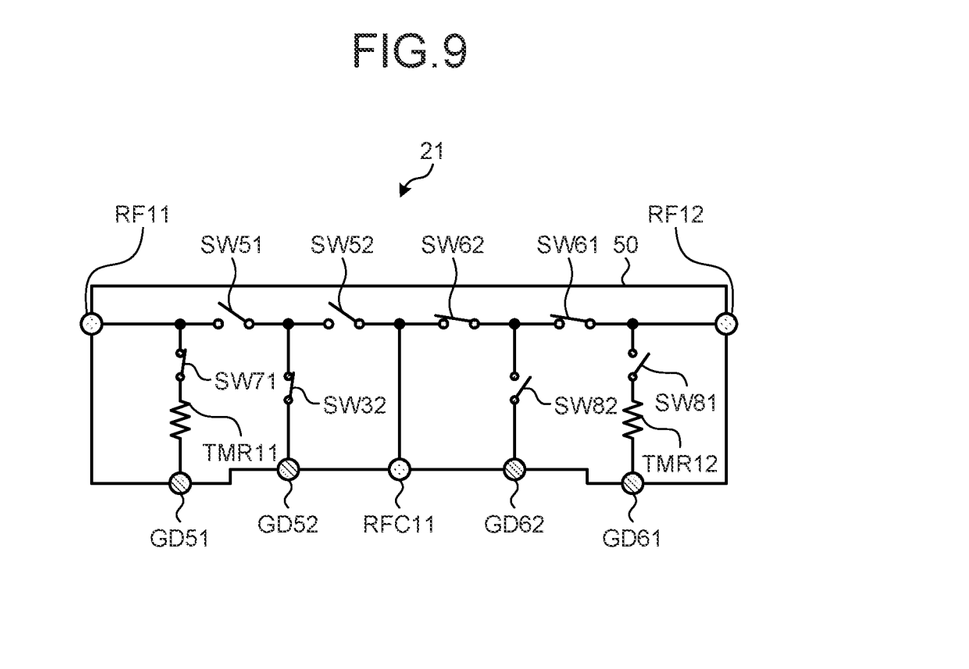
FIG. 9 is a configuration diagram of a conventional SPDT switch circuit.

First, prior to description of the embodiments, a disadvantage of the related art will be described. FIG. 9 is a configuration diagram of a conventional SPDT switch circuit. An SPDT (single-Pole double-throw) switch circuit 50 includes a first RF terminal RF11, a second RF terminal RF12, and an RF common terminal RFC11.

In FIG. 9, a switch SW51 and a switch SW52 between the first RF terminal RF11 and the RF common terminal RFC11 are turned off, and a switch SW61 and a switch SW62 between the second RF terminal RF12 and the RF common terminal RFC11 are turned on.

In this case, the second RF terminal RF12 in the ON state is connected to the RF common terminal RFC11 via the switch SW61 and the switch SW62 to form a signal transmission path.

On the other hand, by being grounded via the switch SW71, a termination resistor TMR11 (for example, 50Ω), and a ground terminal GD51, the first RF terminal RF11 in the OFF state is caused to prevent an unnecessary signal from flowing from the first RF terminal RF11 into the RF common terminal RFC11 and to ensure predetermined isolation characteristics.

Furthermore, a signal transmission line between the switch SW51 and the switch SW52 is also grounded (short-circuited) to a ground terminal GD52 via a switch SW32, thereby further improving the isolation characteristics.

Figure 10:
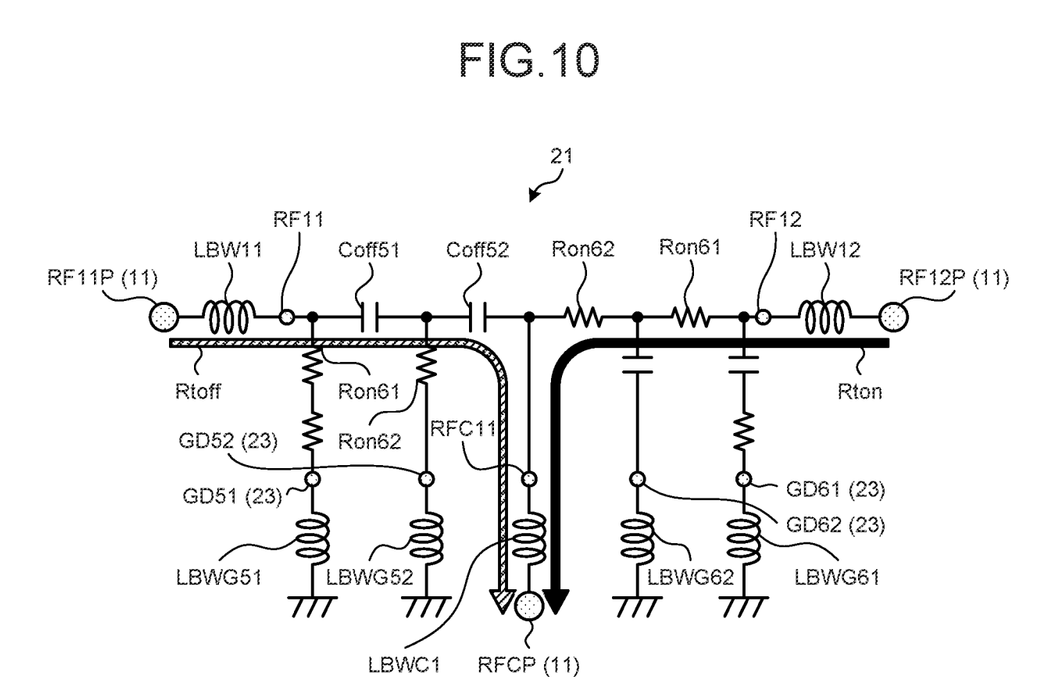
FIG. 10 is an equivalent circuit diagram in which an ON state of a switch in FIG. 9 is modeled by on-resistance and an OFF state is modeled by off-capacitance.

FIG. 10 is an equivalent circuit diagram in which an ON state of a switch in FIG. 9 is modeled by on-resistance and an OFF state is modeled by off-capacitance. Note that in FIG. 10, illustrated is an equivalent circuit in a state where the SPDT switch circuit 50 is housed in a package and each terminal is connected to an electrode pad of the package by wire bonding.

Therefore, inductances LBW11, LBW12, LBWC1, LBWG51, LBWG52, LBWG61, and LBWG62 corresponding to lengths of wire bonding (hereinafter, referred to as wire inductances) from the terminals RF11, RF12, RFC11, GD51, and GD52, GD61, and GD62 of the SPDT 50 to corresponding electrode pads RF11P, RF12P, RFCP, or the ground are added.

On the second RF terminal RF12 side in the ON state, a transmission path Rton to the electrode pad RFCP via on-resistance Ron61 corresponding to the switch SW61, on-resistance Ron62 corresponding to the switch SW62, and the RF common terminal RFC11 is formed.

Meanwhile, also on the first RF11 side in the OFF state, a transmission path Rtoff to the electrode pad RFCP via off-capacitance Coff51 corresponding to the switch SW51, off-capacitance Coff52 corresponding to the switch SW52, and the RF common terminal RFC11 is formed, which deteriorates the isolation characteristics.

Figure 11:
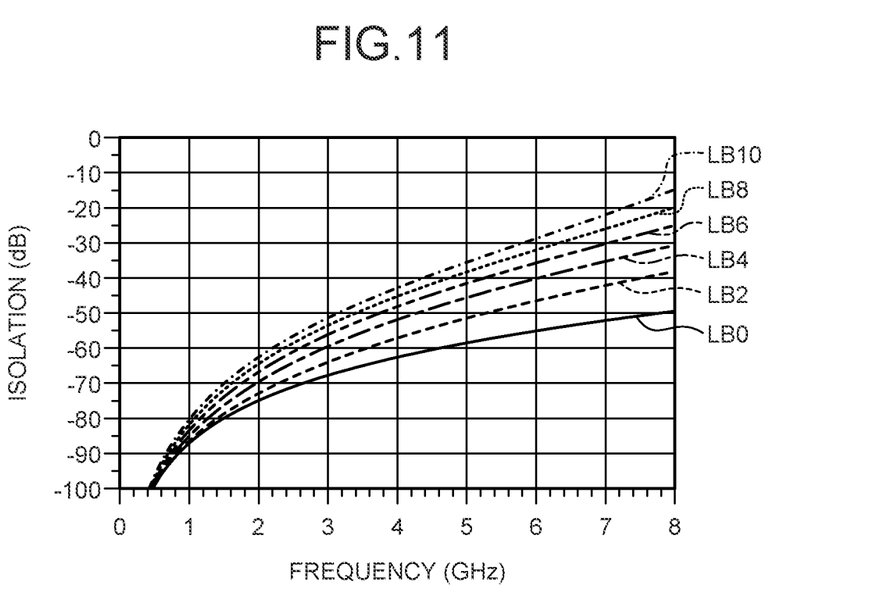
FIG. 11 is an explanatory graph of a relationship between wire inductance and isolation characteristics.

FIG. 11 is an explanatory graph of a relationship between wire inductance and isolation characteristics. In FIG. 11, illustrated is the isolation characteristics in a case where the wire inductance as parasitic inductance is changed in a range of 0 nH to 1 nH. In FIG. 11, the vertical axis represents the isolation decrease amount (in dB), and the horizontal axis represents the frequency of a transmission signal (in GHz).

In FIG. 11, a curve LB0 indicates the isolation degradation amount where wire inductance=0 nH, a curve LB2 indicates the isolation degradation amount where wire inductance=0.2 nH, a curve LB4 indicates the isolation degradation amount where wire inductance=0.4 nH, a curve LB6 indicates the isolation degradation amount where wire inductance=0.6 nH, a curve LB8 indicates the isolation degradation amount where wire inductance=0.8 nH, and a curve LB10 indicates the isolation degradation amount where wire inductance=1 nH.

As illustrated in FIG. 11, it can be seen that, with regards to the isolation decrease amount, the isolation characteristics decrease as the frequency of the transmission signal increases and that the isolation characteristics decrease as the wire inductance, which is parasitic inductance, increases.

The following embodiments provide a high frequency switch and a semiconductor device capable of suppressing degradation of isolation characteristics, which is the above-described problem.

[1] First Embodiment

Figure 1:
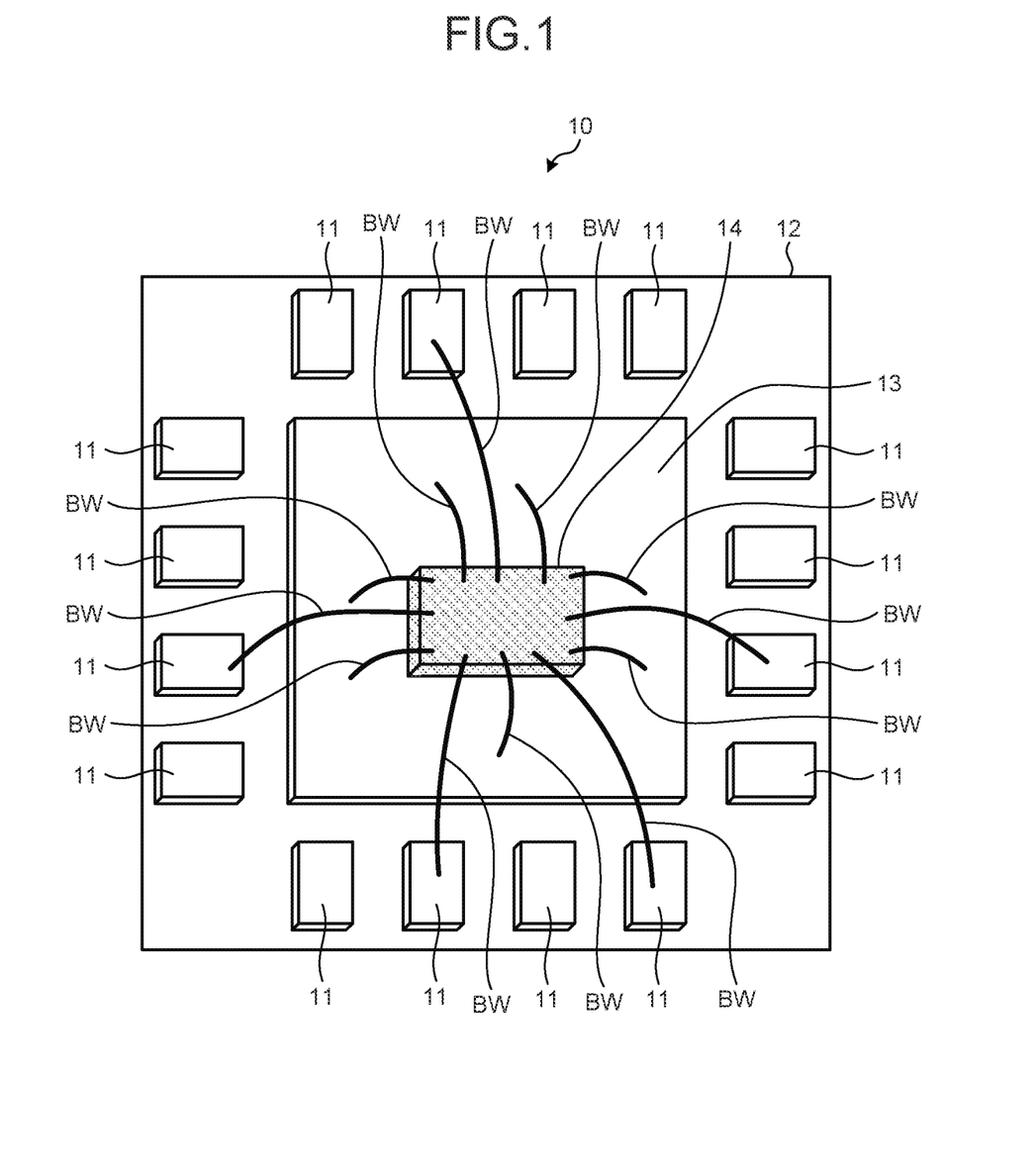
FIG. 1 is a schematic configuration diagram of a semiconductor device according to a first embodiment.

FIG. 1 is a schematic configuration diagram of a semiconductor device according to a first embodiment. A semiconductor device 10 includes: a package 12 having a plurality of lead terminals 11 and formed of resin or ceramics; and a semiconductor chip 14 connected to corresponding lead terminal 11 via wire bonding BW, disposed on a substrate 13, and housed in the package 12.

Figure 2:
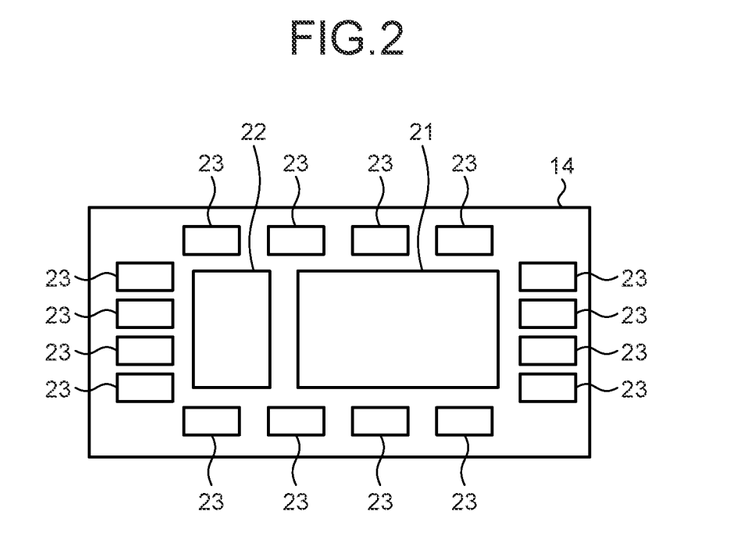
FIG. 2 is a schematic configuration block diagram of a semiconductor chip.

FIG. 2 is a schematic configuration block diagram of the semiconductor chip. In FIG. 2, the semiconductor chip 14 is configured as a high frequency switch IC. The semiconductor chip 14 includes an SPDT switch circuit 21 as an SPnT switch circuit, a controller 22 that controls the SPDT switch circuit 21, and a plurality of electrode pads 23.

Figure 3:
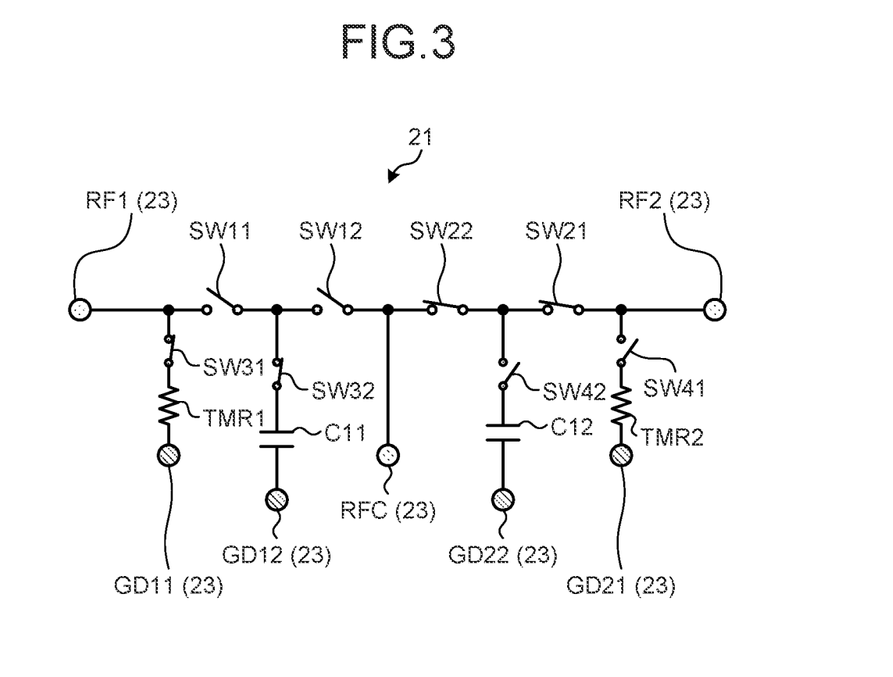
FIG. 3 is a schematic configuration diagram of an SPDT switch circuit according to the first embodiment.

FIG. 3 is a schematic configuration diagram of the SPDT switch circuit according to the first embodiment. The SPDT switch circuit 21 includes a first RF terminal RF1, a second RF terminal RF2, a first ground terminal GD11, a second ground terminal GD12, an RF common terminal RFC, a third ground terminal GD21, and a fourth ground terminal GD22.

In this case, the first RF terminal RF1, the second RF terminal RF2, the first ground terminal GD11, the second ground terminal GD12, the RF common terminal RFC, the third ground terminal GD21, and the fourth ground terminal GD22 are configured as electrode pads 23 in FIG. 2.

The SPDT switch circuit 21 further includes a first throw switch SW11 having one end connected to the first RF terminal RF1 and a first throw switch SW12 having one end connected to another end of the first throw switch SW11 and another end connected to the RF common terminal RFC, the first throw switch SW12 operating in cooperation with the first throw switch SW11. Moreover, the SPDT switch circuit 21 further includes a second throw switch SW21 having one end connected to the second RF terminal RF2 and a second throw switch SW22 having one end connected to another end of the second throw switch SW21 and another end connected to the RF common terminal RFC, the second throw switch SW22 operating in cooperation with the second throw switch SW21.

Furthermore, the SPDT switch circuit 21 includes a first termination switch SW31 having one end connected to the first RF terminal RF1, a first termination resistor TMR1 having one end connected to another end of the first termination switch SW31 and another end connected to the first ground terminal GD11, a first ground switch SW32 having one end connected to the other end of the first throw switch SW11, and a capacitor C11 having one end connected to another end of the first ground switch SW32 and another end connected to the second ground terminal GD12.

In addition, the SPDT switch circuit 21 includes a second termination switch SW41 having one end connected to the second RF terminal RF2, a second termination resistor TMR2 having one end connected to another end of the second termination switch SW41 and another end of connected to the third ground terminal GD21, a second ground switch SW42 having one end connected to the other end of the second throw switch SW21, and a capacitor C12 having one end connected to another end of the second ground switch SW42 and another end connected to the fourth ground terminal GD22.

In the above configuration, a path from the first ground switch SW32 to the second ground terminal GD12 via the capacitor C11 functions as a shunt path. Similarly, a path from the second ground switch SW42 to the fourth ground terminal GD22 via the capacitor C12 functions as a shunt path.

In addition, each of the first throw switch SW11, the first throw switch SW12, the second throw switch SW21, the second throw switch SW22, the first termination switch SW31, the first ground switch SW32, the second termination switch SW41, and the second ground switch SW42 is, in practice, input with a control signal VG to a gate terminal and includes one MOSFET (MOS transistor) or n (n is an integer greater than or equal to 2) MOSFETs (MOS transistors) which are connected in series and are input with a gate voltage signal VG common to the respective gate terminals as a control signal.

In this case, the first throw switch SW11, the first throw switch SW12, the second throw switch SW21, and the second throw switch SW22 each function as a first MOS transistor.

Moreover, the first termination switch SW31 and the second termination switch SW41 function as a third MOS transistor. The first ground switch SW32 and the second ground switch SW42 function as a second MOS transistor.

In addition, the capacitor C11 and the capacitor C12 have an effect of reducing the grounding impedance in a high frequency by canceling out the wire inductance.

Figure 4:
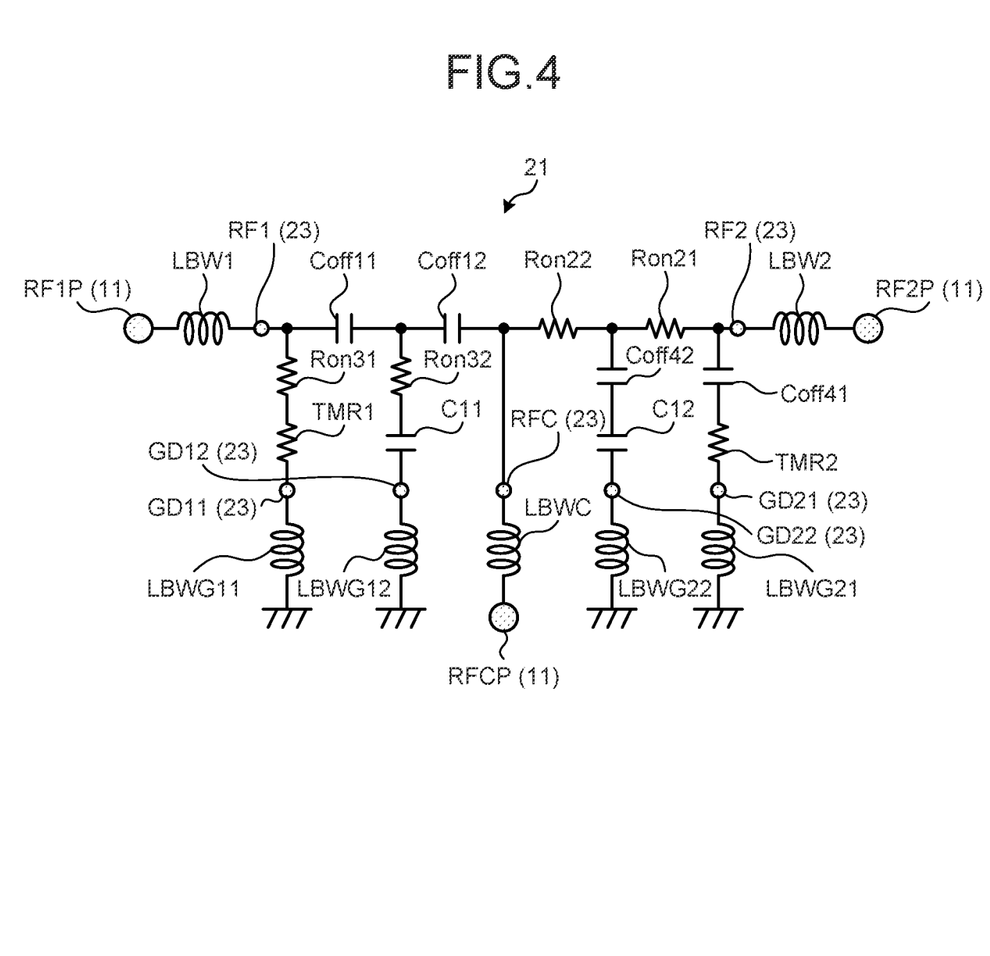
FIG. 4 is an equivalent circuit diagram in which an ON state of a switch in FIG. 3 is modeled by on-resistance and an OFF state is modeled by off-capacitance.

FIG. 4 is an equivalent circuit diagram in which an ON state of a switch in FIG. 3 is modeled by on-resistance and an OFF state is modeled by off-capacitance. Note that also in FIG. 4, illustrated is an equivalent circuit in a state where the SPDT switch circuit 21 is housed in a package and each terminal is connected to an electrode pad of the package by wire bonding.

Therefore, inductances LBW1, LBW2, LBWC, LBWG11, LBWG12, LBWG21, and LBWG22 corresponding to lengths of wire bonding (hereinafter, referred to as wire inductances) from the terminals RF1, RF2, RFC, GD11, GD12, GD21, and GD22 of the SPDT switch circuit 21 to corresponding electrode pads RF1P, RF2P, RFCP, and the ground of the package are added.

On the second RF terminal RF2 side in the ON state, a transmission path to the electrode pad RFCP via on-resistance Ron21 corresponding to the switch SW21, on-resistance Ron22 corresponding to the switch SW22, and the RF common terminal RFC is formed.

In FIG. 3, this is a transmission path from the second RF terminal RF2 to the RF common terminal RFC via the second throw switch SW21 and the second throw switch SW22.

In this case, since the second throw switch SW21 and the second throw switch SW22 in FIG. 3 are in the ON state, they are represented as the on-resistance Ron21 and the on-resistance Ron22. In addition, since the second termination switch SW41 and the second ground switch SW42 are in the OFF state, they are represented as off-capacitance Coff41 and Coff42.

On the other hand, on the first RF terminal RF1 side in the OFF state, since the first throw switch SW11 and the first throw switch SW12 in FIG. 3 are in the OFF state, they are represented as off-capacitance Coff11 and off-capacitance Coff12. In addition, since the first termination switch SW31 and the first ground switch SW32 are in the ON state, they are represented as on-resistance Ron31 and on-resistance Ron32.

In this case, the inductors LBWC and LBWG12 of wire bonding that electrically connects the capacitor C11 and the lead terminal RFCP via an electrode pad 23 included in the ground terminal GD12 causes LC resonance, which reduces the impedance of the transmission path at the resonance frequency by the LC resonance. Therefore, when viewed from the RF common terminal RFC, the first RF terminal RF1 is invisible, and thus the isolation is improved.

Figure 5:
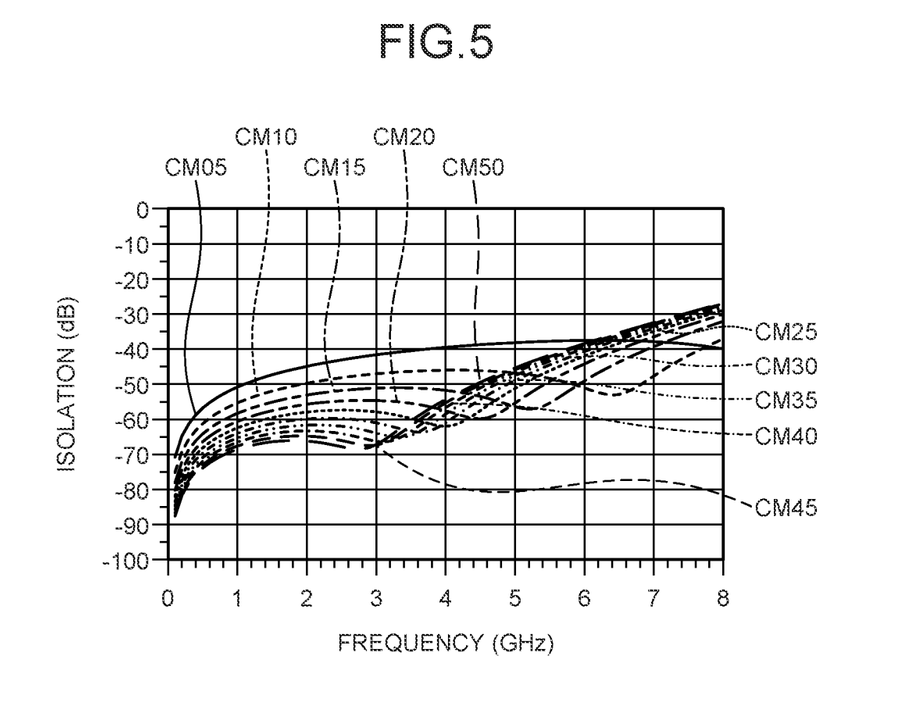
FIG. 5 is an explanatory graph of a relationship between wire inductance and isolation characteristics according to the first embodiment.

FIG. 5 is an explanatory graph of a relationship between wire inductance and isolation characteristics according to the first embodiment. In FIG. 5, the vertical axis represents the isolation decrease amount (in dB), and the horizontal axis represents the frequency of a transmission signal (in GHz).

In FIG. 5, illustrated is the isolation characteristics in a case where the wire inductance as parasitic inductance is 0.6 nH and the capacitance of the capacitor C11 or the capacitor C12 is changed. In FIG. 5, the capacitance of the capacitor C11 or the capacitor C12 is the smallest in the case of a curve CM05 and the largest in the case of a curve CM50.

That is, the magnitude relationship of the capacitance of the capacitor C11 or the capacitor C12 is as follows as indicated by curves.

CM05<CM10<CM15<CM20<CM25<CM30< CM35<CM40<CM45<CM50

In this case, since the resonance frequency in LC resonance decreases as the capacitance of the capacitor C11 or the capacitor C12 increases, the frequency at which the isolation is improved as the capacitance of the capacitor C11 or the capacitor C12 increases is on the low-frequency side.

Therefore, in a case where a circuit is actually designed, it is preferable to set the capacitance depending on the frequency of a transmission signal and the inductance of wire bonding actually used for the capacitor C11 or the capacitor C12.

As described above, according to the first embodiment, since a capacitor having an appropriate capacitance is included in a ground path corresponding to a transmission path in a non-selected state, it is possible to reduce the impedance of the parasitic inductor due to the wire bonding by LC resonance and to improve the isolation.

[2] Second Embodiment

Next, a second embodiment will be described. In the first embodiment, as illustrated in FIG. 5, the isolation is improved on the low-frequency side on an LC resonance frequency side by including the capacitor C11 or the capacitor C12, however, the isolation is deteriorated on the high frequency side. Therefore, an object of the second embodiment is to improve the isolation in wider frequency bands.

Figure 6:
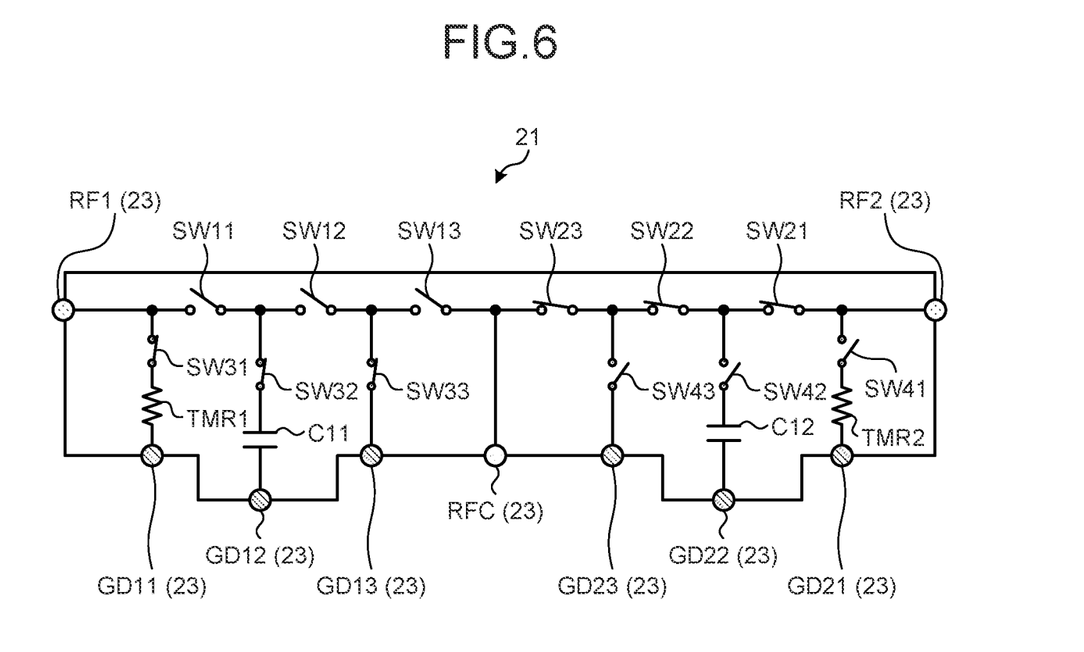
FIG. 6 is a schematic configuration diagram of an SPDT switch circuit according to a second embodiment.

FIG. 6 is a schematic configuration diagram of an SPDT switch circuit according to the second embodiment. An SPDT switch circuit 21 includes a first RF terminal RF1, a second RF terminal RF2, a first ground terminal GD11, a second ground terminal GD12, a third ground terminal GD13, an RF common terminal RFC, a fourth ground terminal GD21, a fifth ground terminal GD22, and a sixth ground terminal GD23.

In this case, it is based on the premise that the first RF terminal RF1, the second RF terminal RF2, the first ground terminal GD11, the second ground terminal GD12, the third ground terminal GD13, the RF common terminal RFC, the fourth ground terminal GD21, the fifth ground terminal GD22, and the sixth ground terminal GD23 are connected to the electrode pads 23 of the semiconductor chip 14 in FIG. 2 or electrode pads (not illustrated) on the substrate 13 via bonding wire BW.

The SPDT switch circuit 21 further includes a first throw switch SW11 having one end connected to the first RF terminal RF1, a first throw switch SW12 having one end connected to another end of the first throw switch SW11 and operating in cooperation with the first throw switch SW11, and a first throw switch SW13 having one end connected to another end of the first throw switch SW12 and another end connected to the RF common terminal RFC and operating in cooperation with the first throw switch SW11 and the first throw switch SW12.

The SPDT switch circuit 21 further includes a second throw switch SW21 having one end connected to the second RF terminal RF2, a second throw switch SW22 having one end connected to another end of the second throw switch SW21 and operating in cooperation with the second throw switch SW21, and a second throw switch SW23 having one end connected to another end of the second throw switch SW22 and another end connected to the RF common terminal RFC and operating in cooperation with the second throw switch SW22.

Furthermore, the SPDT switch circuit 21 includes a first termination switch SW31 having one end connected to the first RF terminal RF1, a first termination resistor TMR1 having one end connected to another end of the first termination switch SW31 and another end connected to the first ground terminal GD11, and a first ground switch SW32 having one end connected to the other end of the first throw switch SW11.

In addition, the SPDT switch circuit 21 includes a capacitor C11 having one end connected to another end of the first ground switch SW32 and another end connected to the second ground terminal GD12 and a first ground switch SW33 having one end connected to the other end of the first throw switch SW12 and another end connected to the third ground terminal GD13.

Furthermore, the SPDT switch circuit 21 includes a second termination switch SW41 having one end connected to the second RF terminal RF2, a second termination resistor TMR2 having one end connected to another end of the second termination switch SW41 and another end connected to the third ground terminal GD21, and a second ground switch SW42 having one end connected to the other end of the second throw switch SW21. In addition, the SPDT switch circuit 21 includes a capacitor C12 having one end connected to another end of the second ground switch SW42 and another end connected to the fourth ground terminal GD22 and a second ground switch SW43 having one end connected to another end of the second throw switch SW22 and another end connected to the fourth ground terminal GD23.

In the above configuration, each of the first throw switches SW11 to SW13, the second throw switches SW21 to SW23, the first termination switch SW31, the first ground switch SW32, the first ground switch SW33, the second termination switch SW41, the second ground switch SW42, and the second ground switch SW43 is, in practice, input with a control signal VG to a gate terminal and includes one MOSFET (MOS transistor) or a plurality of MOSFETs (MOS transistors) connected in parallel. Alternatively, instead of one MOSFET, n (n is an integer greater than or equal to 2) MOSFETs (MOS transistors), which are connected in series and are input with a gate voltage signal VG common to the respective gate terminals as a control signal, are included.

In this case, the first throw switches SW11 to SW13 and the second throw switches SW21 to SW23 each function as a first MOS transistor, and, meanwhile, a set of the first throw switches SW11 to SW13 and a set of the second throw switches SW21 to SW23 are mutually exclusively turned on. Moreover, the first termination switch SW31 and the second termination switch SW41 function as a third MOS transistor. The first ground switch SW32, the first ground switch SW33, the second ground switch SW42, and the second ground switch SW43 function as a second MOS transistor.

In addition, the capacitor C11 and the capacitor C12 have an effect of reducing the grounding impedance in a high frequency by canceling out the wire inductance as in the first embodiment.

In addition, the capacitor C11 is provided to a first ground switch connected to the first RF terminal via the smallest number of throw switches among the plurality of first ground switches SW32 and SW33 included in shunt paths, that is, in the example of FIG. 6, the first ground switch SW32 connected to the first RF terminal via one first throw switch SW11.

Similarly, the capacitor C12 is provided to a second ground switch connected to the first RF terminal via the smallest number of throw switches among the plurality of second ground switches SW42 and SW43 included in shunt paths, that is, in the example of FIG. 6, the second ground switch SW42 connected to the first RF terminal via one second throw switch SW21. The same applies to a case where there are three or more ground switches, that is, a case where there are three or more shunt paths.

Figure 7:
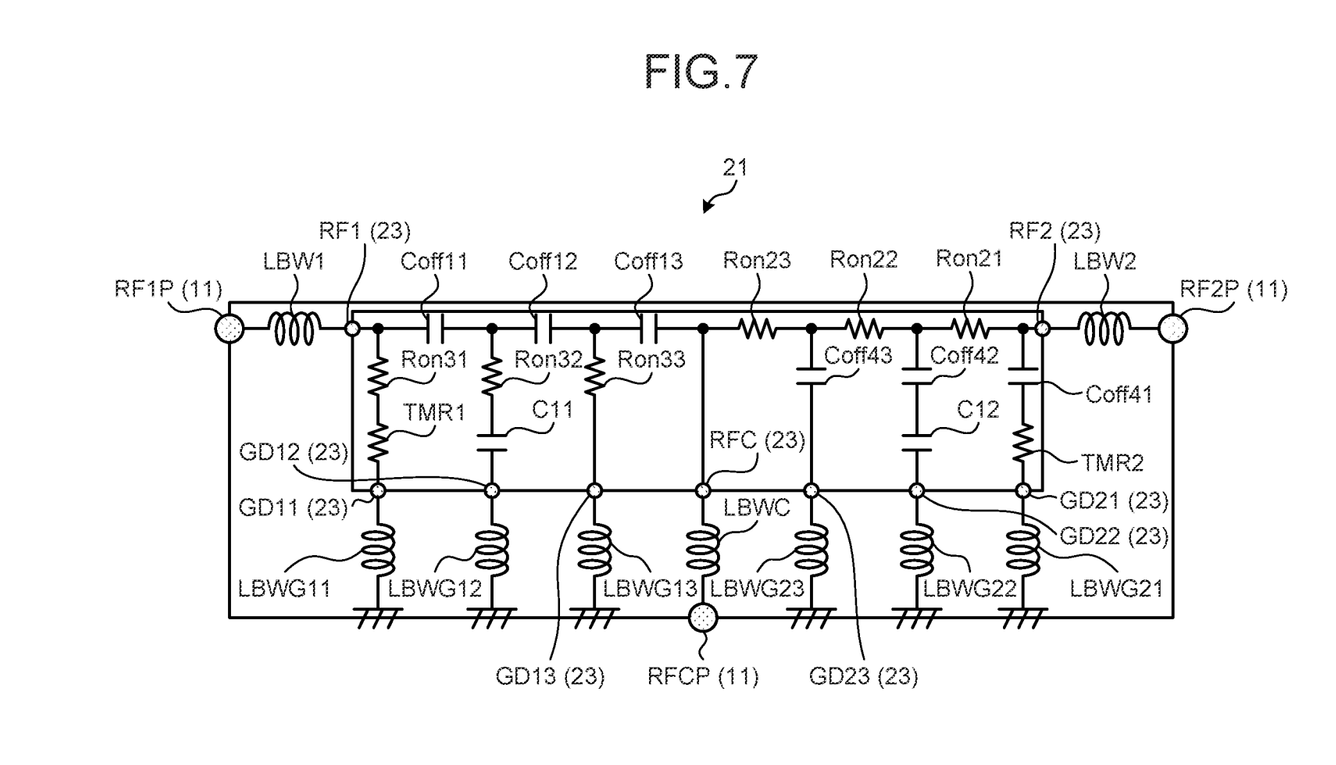
FIG. 7 is an equivalent circuit diagram in which an ON state of a switch in FIG. 6 is modeled by on-resistance and an OFF state is modeled by off-capacitance.

FIG. 7 is an equivalent circuit diagram in which an ON state of a switch in FIG. 6 is modeled by on-resistance and an OFF state is modeled by off-capacitance. Note that also in FIG. 7, illustrated is an equivalent circuit in a state where the SPDT switch circuit is housed in a package and each terminal is connected to an electrode pad of the semiconductor chip 14 by wire bonding.

Therefore, wire inductances LBW1, LBW2, LBWC, LBWG11 to LBWG13, and LBWG21 to LBWG23 corresponding to lengths of wire bonding from the terminals RF1, RF2, RFC, GD11 to GD13, and GD21 to GD23 of the SPDT switch circuit to corresponding electrode pads RF1P, RF2P, RFCP, and the ground of the package are added.

On the second RF terminal RF2 side in the ON state, a transmission path to the electrode pad RFCP via on-resistance Ron21 corresponding to the second throw switch SW21, on-resistance Ron22 corresponding to the second throw switch SW22, on-resistance Ron23 corresponding to the second throw switch SW23, and the RF common terminal RFC is formed.

In FIG. 7, this is a transmission path from the second RF terminal RF2 to the RF common terminal RFC via the second throw switch SW21, the second throw switch SW22, and the second throw switch SW23.

In this case, since the second throw switches SW21 to SW23 in FIG. 6 are in the ON state, they are represented as the on-resistances Ron21 to Ron23, and since the second termination switch SW41 and the second ground switches SW42 and SW43 are in the OFF state, they are represented as off-capacitance Coff41 to Coff43.

On the other hand, on the first RF terminal RF1 side in the OFF state, since the first throw switches SW11 to SW13 in FIG. 6 are in the OFF state, they are represented as off-capacitance Coff11 to Coff13, and since the first termination switch SW31, the first ground switch SW32, and the first ground switch SW33 are in the ON state, they are represented as on-resistance Ron31 to Ron33.

In this case, inductor LBWG12 of wire bonding that electrically connects the capacitor C11 and the ground via an electrode pad 23 included in the ground terminal GD12 causes LC resonance, which reduces the impedance of the transmission path at the resonance frequency by the LC resonance. Therefore, when viewed from the RF common terminal RFC, the first RF terminal RF1 is invisible, and thus the isolation of a high frequency component is improved.

In addition, inductor LBWG13 of wire bonding that electrically connects the first ground switch SW33 and the ground via an electrode pad 23 included in the ground terminal GD13 functions as a low-pass filter, reduces impedance in a low-frequency component, and improves isolation of the low-frequency component. That is, isolation can be improved in wide frequency bands.

Figure 8:
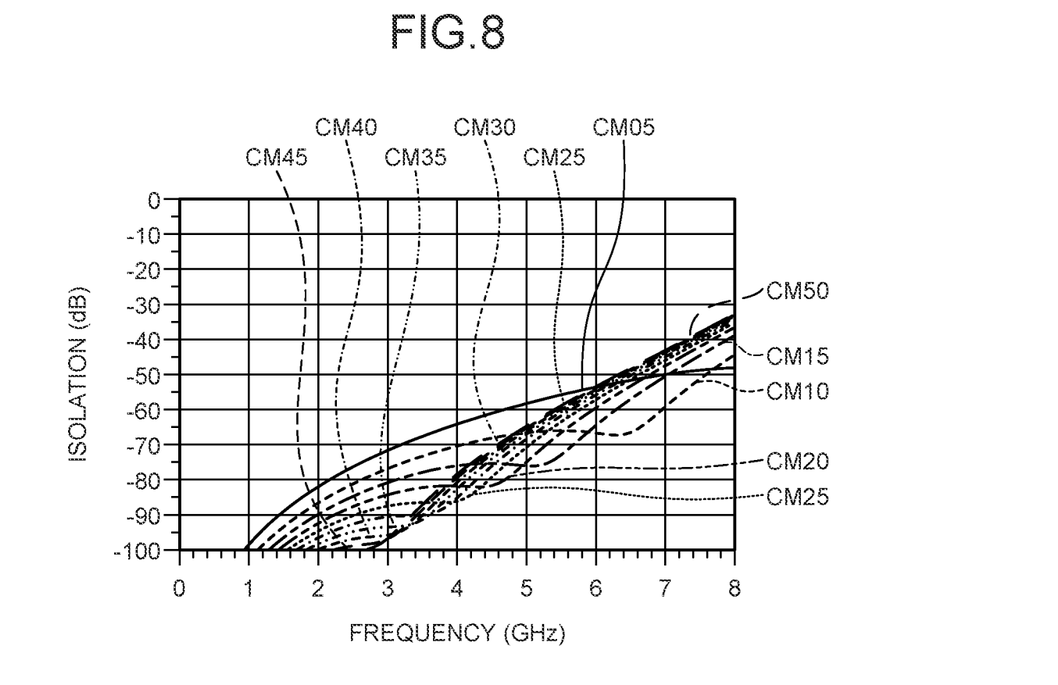
FIG. 8 is an explanatory diagram of a relationship between wire inductance and isolation characteristics according to the second embodiment.

FIG. 8 is an explanatory diagram of a relationship between wire inductance and isolation characteristics according to the second embodiment. In FIG. 8, the vertical axis represents the isolation decrease amount (in dB), and the horizontal axis represents the frequency of a transmission signal (in GHz).

In FIG. 8, illustrated is the isolation characteristics in a case where the wire inductance as parasitic inductance is 0.6 nH and the capacitance of the capacitor C11 or the capacitor C12 is changed. In FIG. 8, the capacitance of the capacitor C11 or the capacitor C12 is the smallest in the case of a curve CM05 and the largest in the case of a curve CM50.

That is, the magnitude relationship of the capacitance of the capacitor C11 or the capacitor C12 is as follows as indicated by curves.

CM05<CM10<CM15<CM20<CM25<CM30< CM35<CM40<CM45<CM50

In this case, since the resonance frequency in LC resonance decreases as the capacitance of the capacitor C11 or the capacitor C12 increases, the frequency at which the isolation is improved as the capacitance of the capacitor C11 or the capacitor C12 increases is on the low-frequency side.

Therefore, in a case where a circuit is actually designed, it is preferable to set the capacitance depending on the frequency of a transmission signal and the wire inductance actually used for the capacitor C11 or the capacitor C12.

Furthermore, the inductor LBWG13 of the wire bonding that electrically connects the first ground switch SW33 and the ground via an electrode pad 23 included in the ground terminal GD13 and the inductor LBWG23 of the wire bonding that electrically connects the second ground switch SW43 and the ground via an electrode pad 23 included in the ground terminal GD23 function as low-pass filters. Therefore, the impedance in a low-frequency component is reduced, and the isolation of the low-frequency component is improved.

As a result, according to the second embodiment, a capacitor is included in a ground path corresponding to a transmission path in a non-selected state, thereby reducing the impedance of a transmission path in the high frequency region and reducing the impedance in the low frequency region of an adjacent ground path. Therefore, the impedance can be reduced in wide frequency bands, and as a result, the isolation can be improved in the wide frequency bands.

In the above description, the case of the SPDT switch circuit in which n is 2 has been described, however, it is similarly applicable to transmission paths of n systems of an SPnT switch circuit in which n is greater than or equal to 3.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A high frequency switch of a single pole n throw (SPnT) type having n (n is an integer greater than or equal to 2) RF terminals and one RF common terminal, the high frequency switch comprising:
    m (m is an integer greater than or equal to 2) first MOS transistors connected in series between one of the n RF terminals and the RF common terminal;
    (m−1) second MOS transistors having ends each connected to adjacent first MOS transistors among the m first MOS transistors; and
    a capacitor connected between ground and another end of a second MOS transistor having one end connected to another end of a first MOS transistor having one end connected to the one of the RF terminals among the first and second MOS transistors.

2. The high frequency switch according to claim 1, further comprising:
    a third MOS transistor having one end connected to the one of the RF terminals; and
    a termination resistor provided between another end of the third MOS transistor and ground.

3. The high frequency switch according to claim 1, wherein
    in a case where m is greater than or equal to 3, another end of a second MOS transistor other than the second MOS transistor to which the capacitor is connected, among the second MOS transistors, is connected to ground.

4. The high frequency switch according to claim 1, wherein
    a capacitance of the capacitor is set in such a manner that a signal transmitted between the one of the RF terminals and the RF common terminal flows through the capacitor side rather than the RF common terminal side on a basis of a frequency of the signal.

5. The high frequency switch according to claim 4, wherein
    the capacitance of the capacitor is set in such a manner that a resonance frequency with inductance of wire bonding connected to a transmission path to the ground is equal to the frequency.

6. A semiconductor device comprising:
    a high frequency switch circuit of a single-pole-n-throw (SPnT) type having n (n is an integer greater than or equal to 2) RF terminals and one RF common terminal; and
    a controller,
    the high frequency switch circuit including:
        m (m is an integer greater than or equal to 2) first MOS transistors connected in series between one of the n RF terminals and the RF common terminal;
        (m−1) second MOS transistors having ends each connected to adjacent first MOS transistors among the m first MOS transistors; and
        a capacitor connected between ground and another end of a second MOS transistor having one end connected to another end of a first MOS transistor having one end connected to the one of the RF terminals among the first and second MOS transistors, and
    the controller being configured to output a control signal to the m first MOS transistors and the (m−1) second MOS transistors to perform switching so that an on or off state of the m first MOS transistors and an on or off state of the (m−1) second MOS transistors are different from each other.

7. The semiconductor device according to claim 6, wherein
    the high frequency switch circuit further includes a third MOS transistor having one end connected to the one of the RF terminals and a termination resistor provided between another end of the third MOS transistor and ground, and
    the controller is configured to output a control signal to the third MOS transistor to perform switching so that an on or off state of the third MOS transistor becomes a same as the on or off state of the (m−1) second MOS transistors.

8. The semiconductor device according to claim 6, wherein
    in a case where m is greater than or equal to 3, another end of a second MOS transistor other than the second MOS transistor to which the capacitor is connected, among the (m−1) second MOS transistors, is connected to ground.

9. The semiconductor device according to claim 6, wherein
    a capacitance of the capacitor is set in such a manner that a signal transmitted between the one of the RF terminals and the RF common terminal flows through the capacitor side rather than the RF common terminal side on a basis of a frequency of the signal.

10. The semiconductor device according to claim 9, wherein
the capacitance of the capacitor is set in such a manner that a resonance frequency with inductance of wire bonding connected to a transmission path to the ground is equal to the frequency.

* * * * *